United States Patent [19]

Popek

[11] Patent Number: 5,164,627

[45] Date of Patent: Nov. 17, 1992

[54] PHASED ARRAY ACOUSTIC SIGNAL PROCESSOR

[75] Inventor: Marc H. Popek, Indian Harbor Beach, Fla.

[73] Assignee: Harris Corporation, Melbourne, Fla.

[21] Appl. No.: 228,333

[22] Filed: Jul. 26, 1988

[51] Int. Cl.$^5$ .................... H01L 41/04; H01L 41/08; H01L 41/18
[52] U.S. Cl. ................................ 310/313 B; 333/193
[58] Field of Search ..................... 310/313 B; 333/193

[56] References Cited

U.S. PATENT DOCUMENTS 4,217,563 8/1980 Vale ..................................... 333/193
4,590,442 5/1986 Saito et al. .......................... 333/193

Primary Examiner—Theodore M. Blum
Attorney, Agent, or Firm—Evenson, Wands, Edwards, Lenahan & McKeown

[57] ABSTRACT

A bulk acoustic signal processor for processing GHz range R.F. signals employs a transmitter array comprised of an apodized set of subdivided interdigital electrodes mounted on a bulk wave launching crystal, the apodization being defined by the shape of an aperture in a layer of dielectric material on the crystal, over which the electrodes extend into contact with the surface of crystal for stressing the crystal and launching an acoustic wave into the bulk on which the crystal is mounted. Because a respective subdivided set of interdigital electrode elements has an impedance on the order of 0.5 to 6 ohms, each set is driven by a dedicated, impedance-transforming GaAs FET source-follower amplifier. When driven by an R.F. input signal, the respective sets of driver electrodes launch a focused set of acoustic waves which effectively spatially combine with one another to form a directed bulk wave whose direction of travel in the bulk is proportional to the input frequency and whose intensity is sufficient to enable the input energy to be detected by a spaced apart receiver electrode array. The receiver electrode array, similar to its transmitter counterpart, is formed of a plurality of interleaved electrode layers or fingers which extend over the layer of dielectric atop the lithium niobate crystal and into a receiver array aperture in the dielectric layer into contact with the surface of the crystal.

17 Claims, 3 Drawing Sheets

PHASED ARRAY ACOUSTIC SIGNAL PROCESSOR

The United States Government has rights in the present invention under Contract No. F30602-86-C-0266 with the U.S. Department of the Air Force.

FIELD OF THE INVENTION

The present invention relates in general to acoustic signal processing systems and is particularly directed to a signal processor for spatially combining the microwave signal power that is applied to a plurality of apodized interdigital acoustic transducer electrodes of a phased array acoustic wave transmitter.

BACKGROUND OF THE INVENTION

Radio frequency signal processors, such as channelizers for analyzing radar receivers have typically employed the use of electro-optic components, such as Bragg cells, through which an acoustically modulated input optical (laser) beam is controllably modified (deflected) to become incident upon an array of photodetectors, the outputs of which define the frequency characteristics of the signal of interest. In addition, bulk wave signal processors that are effectively exclusively acoustic, and avoid the physical complexity shortcomings of acousto-optic devices, using focussed acoustic waves and operating at relatively low frequencies (on the order of several MHz), have been proposed for radio wave signal processing.

One example of such a focussed acoustic wave (FAW) signal processor, specifically an I.F. channelizer, is described in the U.S. Pat. No. 4,692,722 to Reichel. As detailed in the patent, a beam steering array of electro-acoustic elements, to which a signal to be analyzed is applied, is located on a first surface portion of bulk material into which the acoustic wave is launched by the array. Spaced apart from the beam steering array on a second surface portion of the bulk is an array of receiver transducers. The acoustic beam, the launch direction of which into the bulk is governed by the frequency of the input signal, is focussed by the bulk onto the receiver array for analysis.

Now, although the patented scheme is intended to obviate hardware and opto-electric component sensitivity limitations of conventional acousto optic signal processors, its useful frequency range is limited to a bandwidth considerably less than that to which acousto-optic signal processors are applied, so that one cannot simply make an acoustic processor for acousto-optic processor substitution and expect success. As noted above, the patented acoustic processing system is described as being operational at I.F. frequencies (the example given referencing a typical frequency range of 1-2 MHz), which are considerably less than the GigaHertz frequency range at which many of today's microwave communications and detection systems are designed to operate. The application of a bulk acoustic processor to higher (R.F.) frequencies has not been accomplished because of a number of limitations on the physical and electrical properties of both the launch and the receptor array.

More particularly, as the frequency of the applied signal increases, the extremely close spacing of the physical components and the sheer number of components required (often on the order of several hundred to a thousand) for analyzing a reasonably wide bandwidth (1-10 Ghz) become substantial architecture and performance constraints in the construction and operation of a realizable system. In a large numbered, multi-component transducer array, with hundreds of narrow linewidth transducer elements connected in parallel, the impedance seen by the signal driver may be on the order of thousandths of an ohm, which is considerably less than the 50 ohm impedance of the driver, and thereby severely limits the available bandwidth (which is proportional to the square root-ratio of the driver and source impedances).

One proposal to increase the effective source impedance seen by the driver electronics has been to make a series of physical cuts or scribes in the surface of the bulk material in order to form a series connection of separate portions of the array in series. However, for the extremely narrow linewidths (micron dimensions) required for an array comprised of hundreds of interdigital or finger electrodes, implementing such a proposal is a practically impossible. A second proposal would be to drive the array from a low impedance driver. Again, however, the suggestion is not realistic, as signal amplifiers do not customarily have extremely low output impedances (e.g. in the neighborhood of one to five ohms).

SUMMARY OF THE INVENTION

In accordance with the present invention, the operational frequency limitations of currently proposed bulk acoustic signal processors are overcome by a phased array architecture having on the order of a thousand transducer elements, which are capable of being driven with R.F. signals in a multi-GigaHertz frequency range. For this purpose, the transducer array itself comprises an apodized set of subdivided interdigital electrode elements mounted on a bulk wave launching crystal material, such as lithium niobate. The apodization is defined by the shape of an aperture in a layer of dielectric material on the crystal, over which the electrodes extend into contact with the surface of crystal exposed by the aperture to form excitation electrodes for stressing the crystal and launching the acoustic wave into the bulk on which the crystal is mounted. A respective subdivided and parallel-connected set of interdigital electrode elements has an impedance on the order of 0.5 to 6 ohms (depending on the number per set and physical parameters) and is driven by a dedicated, impedance-transforming GaAs FET source follower amplifier which is mounted in close proximity with the interconnect extensions of the drive electrodes, (which form low impedance transmission lines between the output of the amplifiers and the transducer electrodes). Paired groups of the subdivided sets of interdigital electrodes are arranged and driven in a complementary, push-pull configuration, so as to form a physically electrically balanced array. When driven by an R.F. input signal, the respective sets of driver electrodes launch focused acoustic waves which effectively spatially combine with one another in the bulk material, to form a directed bulk wave whose direction of travel in the bulk is proportional to the input frequency and whose intensity is sufficient to enable the acoustic energy beam to be detected by a spaced apart receiver electrode array.

The receiver electrode array, similar to its transmitter counterpart, is formed of a plurality of interleaved electrode layers, or fingers, which extend over the layer of dielectric atop the lithium niobate crystal and into a receiver array aperture in the dielectric layer into contact with the surface of the crystal. To minimize crosstalk between the transmission line interconnect to the receiver electrodes and that to the electrodes of the transmitter array, the signal lines to the respective arrays are arranged atop the dielectric layer in generally mutually orthogonal directions. The receiver electrode signal lines are coupled to impedance matching output buffer amplifiers to bring the impedance seen by downstream signal processing circuity up to standard (50 ohms).

DETAILED DESCRIPTION

Figure 1:
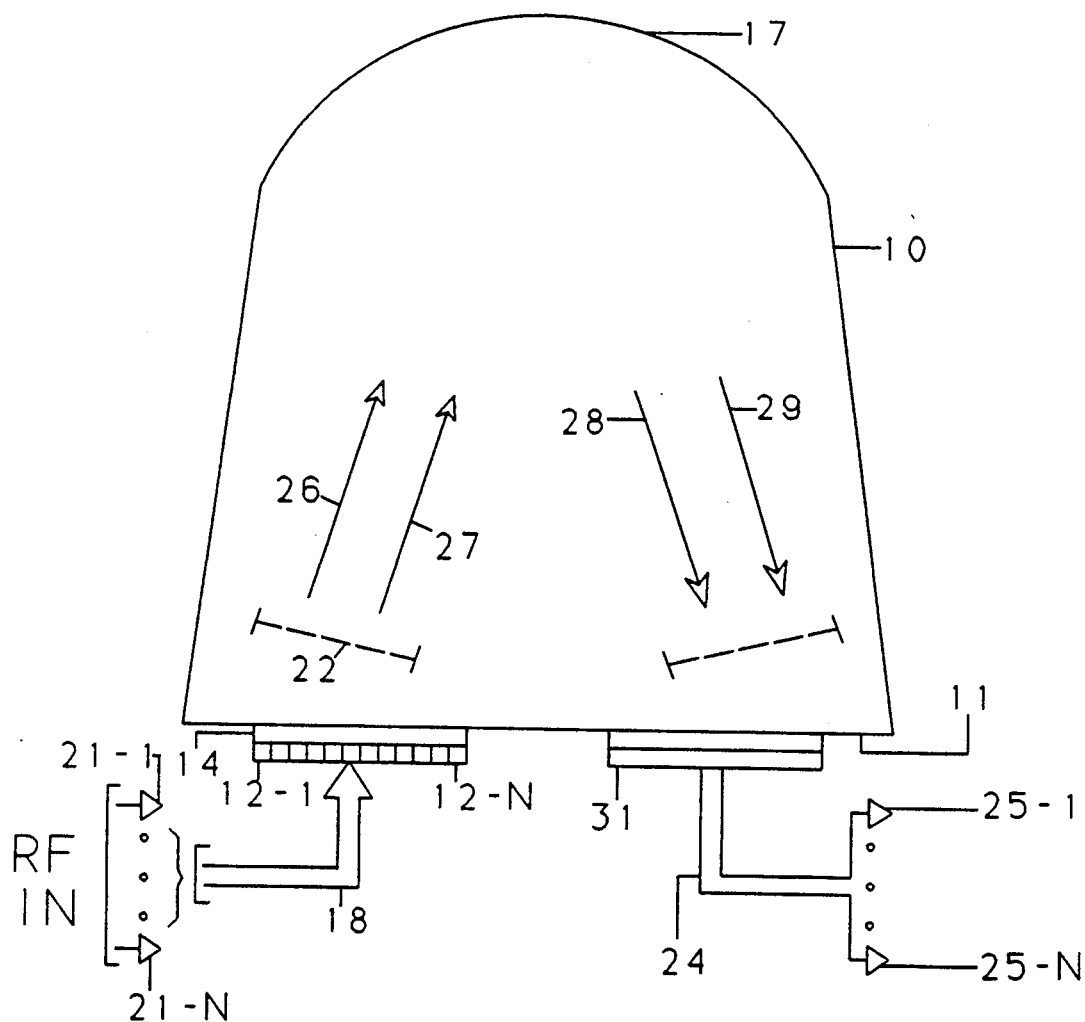
FIG. 1 diagrammatically illustrates the overall architecture of a focussed acoustic wave signal processor.

Referring now to FIG. 1, the overall architecture of a focussed acoustic wave signal processor is illustrated as comprising an acoustic bulk 10 into which an acoustic wave is to be launched. The material of which bulk 10 is comprised may be an optically transmissive material, such as quartz or lithium niobate, or a non-optically transmissive material, such as YAG (since the signal processing mechanism considered here is exclusively acoustic, rather than acousto-optic). As shown in the Figure, acoustic bulk 10 has a first planar surface 11 on which is distributed a plurality (phased array) 12 of acoustic wave launching transducers, to which an (R.F.) electrical signal to be processed is applied. For this purpose, in accordance with the present invention and as will be described in detail below with reference to FIGS. 2 and 3, transducer array 12 is preferably comprised of a phased array of interdigital transducer electrodes 20 arranged in sets 12-1, 12-2 . . . 12-N in contact with the top surface 13 of a layer 14 of acoustic wave generating material 14, such as the above-mentioned lithium niobate crystal, the bottom surface 15 of which is mounted to the planar surface 11 of acoustic bulk 10 via a (chrome/gold) ground plane electrode layer 16 interposed therebetween. The respective sets 12-1 . . . 12-N of the interdigital electrodes of phased array 12 are driven by an R.F. signal of interest via a set of dedicated source-follower configured impedance-transforming FET amplifiers 21-1 . . . 21-N, so as cause an acoustic wave to be dispersed into and reflect from a rear surface portion 17 of the bulk.

Figure 4:
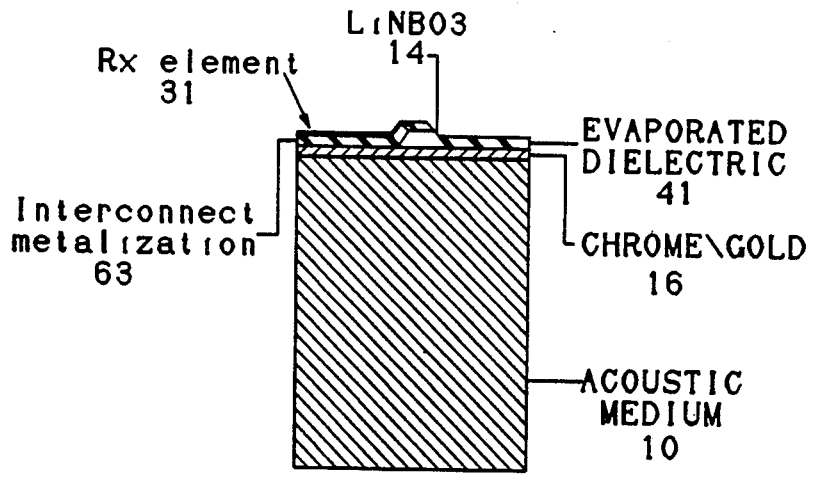

Spaced apart from the acoustic wave launching phased array 12 is a multi-element receiving transducer array 31 disposed on a second portion of planar surface 11 of the bulk. Like transmitter array 12, transducer array 31 is preferably comprised of a plurality of interdigital transducer electrodes (the cross-section of an individual one of which is shown in FIG. 4 to be described below) disposed on the top surface 13 of spaced apart portions of the lithium niobate crystal layer 14 upon which the transmitter phased array 12 is formed. The outputs of the electrodes of receiver transducer array 31 are coupled over signal lines 24 to output impedance transformation amplifier 25 for generating signals representative of the received acoustic wave.

By virtue of the phased array configuration of transmitter array 12 on acoustic bulk 10, there is effectively obtained a dispersion of RF input signals applied thereto. Namely, as indicated by the solid lines and broken lines within the bulk 10, the acoustic beam that is launched by array 12 is directive, in accordance with the frequency of the R.F. inputs signals applied to the array. The direction of travel of the acoustic beam in the bulk 10, namely, the angle of emission of the beam relative to the plane of the transducer array 12 on surface 11, increases with a decrease in frequency of the input R.F. signal. Thus, the solid line beam 26, corresponding to a higher input frequency, has a lower angle of emission relative to a direction normal to planar surface 11 than does the broken line beam 27, which corresponds to an acoustic beam of lower input frequency R.F. signals.

Rear reflective surface 17 of bulk 10, opposite to that of surface 11, is preferably concave, so as to effectively focus or concentrate acoustic energy incident on surface 17 towards receiver array 31. As a result, the beam (26 or 27) emitted by array 12 emerges as a focussed beam (28 or 29) and is incident upon a portion of the receiving array 31 in accordance with the frequency of the input signal.

Figure 2:
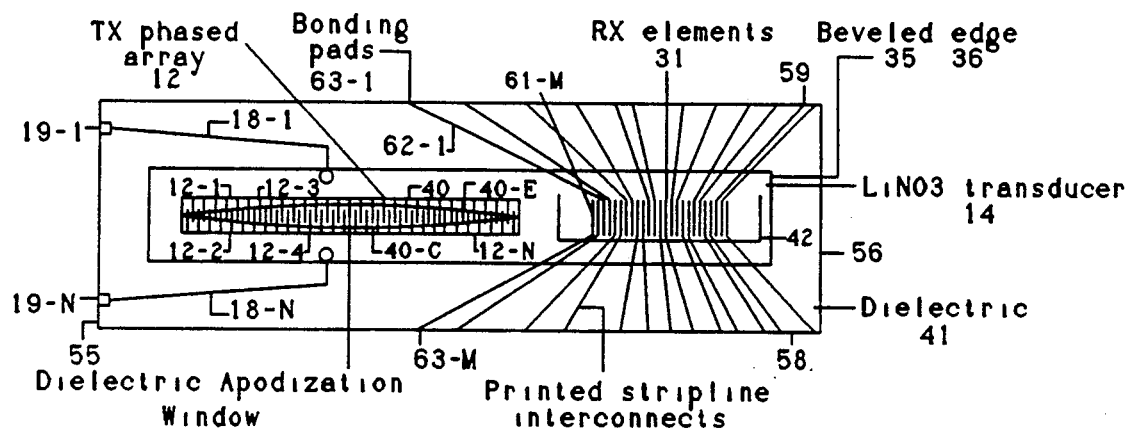
FIG. 2 is a top view of the configuration of the transmitter and receiver electrode arrays of a focussed acoustic wave signal processor in accordance with the present invention.
Figure 3:
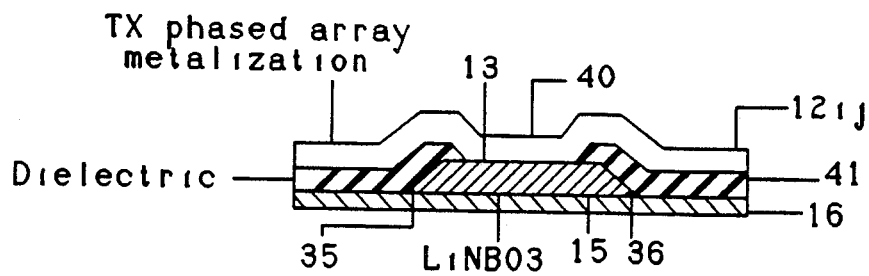
FIGS. 3 and 4 depict respective cross-sectional views of an individual transducer element of the transmitter and receiver arrays.

Referring now to FIG. 2, there is shown a top or plan view of the transmitter phased array 12 and the receiver array 31 which are mounted on surface 11 of the acoustic bulk 10. Respective cross-sectional views of an individual transducer element of the transmitter and receiver arrays are depicted in FIGS. 3 and 4, respectively. As shown in the cross-sectional view of FIG. 3 and as explained briefly above, on the top planar surface 11 of the acoustic bulk medium 10 a thin chrome/gold ground plane layer 16, having a thickness on the order of 100 microns is formed. Mounted to the ground plane layer 16 is an acoustic wave generating/responsive medium 14, such as quartz or lithium niobate crystal layer, the sides of which are beveled or inclined as shown at 35 and 36 in FIG. 4 to facilitate step coverage of an overlying dielectric layer 41 thereon. Through an aperture 40 in dielectric layer 41, the top surface 13 of crystal 14 is exposed, so that electrodes 12 that overlie dielectric layer 41 may extend onto and contact crystal 14.

As shown in the plan view of FIG. 2, lithium niobate crystal layer 14 covers a central stripe portion 51 of the surface 11 of the acoustic bulk 10. For an acoustic bulk 10 having dimensions of 1X1X1cm$^3$, lithium niobate crystal 14 may have a length of 1 cm, a width of 2 mm and thickness of 1 mm.

As noted above, selectively formed atop the ground plane layer 16 and the lithium niobate crystal layer 14 is a layer of dielectric material (e.g. silicon dioxide) 41 having a thickness on the order of 1μ. Dielectric layer 41 may be formed by RF sputtering and then selectively etched to form an apodization aperture 40 in a first region whereat the transmitter electrodes of array 12 are to be formed, and an aperture 42 whereat the interdigital electrodes of receiver array 31 are to be formed. As shown in the plan view of FIG. 2, the contour of transmitter apodization aperture 40 in such that it is widest at its central portion 40-C and converges to a narrow eye shape at its opposite ends 40-E. In the region whereat the receiver array 31 is to be formed, aperture 42 is essentially rectangularly shaped.

As shown in the cross-sectional illustration of an individual transmitter transducer in FIG. 3, a respective interdigital finger 12-ij of an electrode set 12-i is comprised of a metallic layer such as gold, that has been deposited on dielectric layer 41 and then selectively lithographically patterned by lift-off removal, so as to define the separation and configuration of an individual transducer electrode and interconnects 18 which extend over dielectric layer 41 through the apodization aperture 40 and onto the exposed surface 13 of the lithium niobate crystal 14. For a signal processing device operating at R.F. frequencies in a range of 1-10 GHz, as many as 900 transducer electrodes, each having a width of 1μ and an interelectrode spacing of 10μ and covering a 2 mm section of the lithium niobate stripe 51 may be formed.

The patterning of the metallic layer to form electrode array 12 is such that individual interdigital electrodes which are formed on the exposed surface of the lithium niobate through apodization window 41 are interconnected in respectively interleaved and adjacent sets 12-1 . . . 12-N. Typically the impedance of an individual electrode element is on the order of 10-30 ohms. When 30 electrodes are interconnected in parallel to form an electrode set 12-i, the resulting impedance of the set is on the order of 1-2 ohms. Interconnect conductor layers 18-1 . . . 18-N extend over dielectric layer 41 from the outer edge 55 of the surface 11 to respective ones of the sets 12-1 . . . 12-N of interconnected interdigital electrodes. As can be seen from the top view of FIG. 2, interconnect electrode layers 18-1 . . . 18N preferably extend in parallel to the longitudinal directed lithium niobate stripe 51, so as to define a first interconnect direction. Bonding pads 19-1 . . . 19-N are provided along crystal edge 55 for providing signal coupling terminals for input drivers 21-1 . . . 21-N for exciting the transmitter electrode array 12.

The receiver array 31 is comprised of a set of interdigital electrodes 61-1 . . . 61-M, the spacing among which defines a prescribed spacial filter function, with interconnect to the electrodes being provided by way of fan-out printed strip line interconnect layers 62-1 . . . 62-M extending to bonding pads 63-1 . . . 63-M on opposite sides of the top surface of the crystal.

The electrodes and interconnect metal of the transmitter electrode array 12 and the electrodes and associated fan-out interconnect of the receiver array 31 are preferably patterned during the same photolithographic processing step. As can be seen from FIG. 2, the direction of the fan-out of interconnect layers 62-1 . . . 62-M for the electrodes 61-1 . . . 61-M of the receiver array 31 extend essentially toward opposite parallel edges 58 and 59 of the crystal 14, so as to be essentially orthogonal to the direction of interconnect layers 18-1 . . . 18-N and thereby minimize cross-talk between the transmitter interconnect signal lines 18 and the receiver interconnect signal lines 61.

As shown in the cross-sectional view of FIG. 4, an individual receiver transducer electrode 61-i overlies dielectric layer 41 and extends through receiver array aperture 42 onto an exposed area 60 of the top surface 11 of crystal 14. Contiguous with electrode 61-i is an associated interconnect metal strip 62-i formed atop and extending thereover to a bonding pad 63-i at an outer edge (58/59) of the bulk.

Typically, each of electrodes 61-i has a thickness of 1 μm, a width of 60 μm and a length of 100 μm in aperture 42. The separation between adjacent electrodes 61 in array 31 lies in a range of 30 μm to 100 μm. The combined (series) impedance of an individual electrode 61-i and its associated interconnect layer 62 is on the order of 25 ohms.

Figure 5:
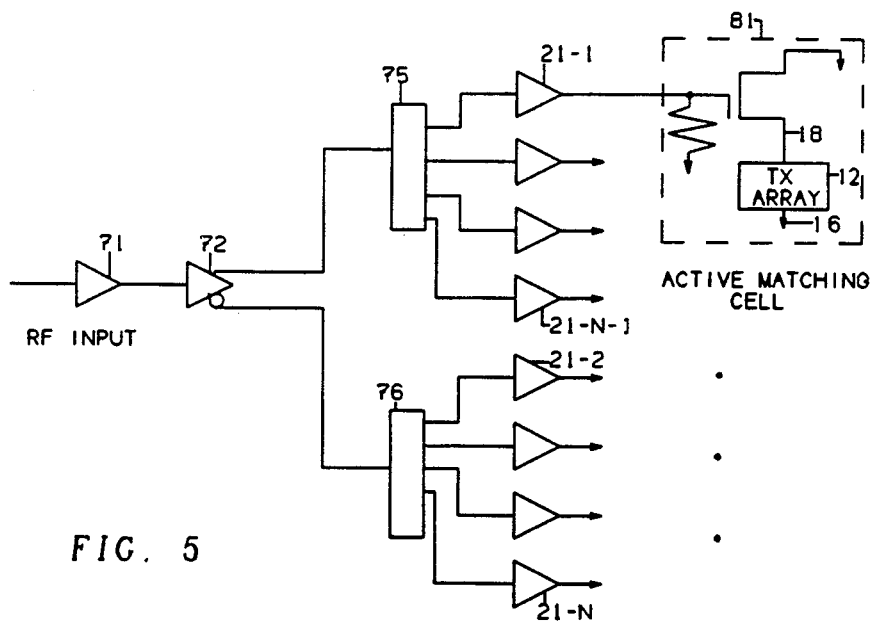
FIG. 5 diagrammatically illustrates driver circuitry for the respective sets of excitation electrodes of the transmitter array.

FIG. 5 diagrammatically illustrates the driver circuitry for the respective sets of excitation electrodes of the transmitter array. As shown therein, an R.F. input signal is applied to a low noise amplifier 71, the output of which is coupled to a 180° phase splitter 72 for supplying respective complementary outputs to a first set of drivers 21-1 . . . 21--N-1 and a second set of drivers 21-2, 21-4 . . . 21-N. Drivers 21-1 . . . 21-N-1 are coupled to a power distribution circuit 75 (describe) which distributes an in-phase replica of the input R.F. signal supplied by phase-splitter 72. Drivers 21-2 . . . 21-N are coupled to a power distribution circuit 76 which distributes complementary phase versions of the R.F. input signal.

As pointed out previously, because of the low input impedance (on the order of 1-5 ohms) provided by each set of transmitter of electrodes 21-1 . . . 21-N, an impedance coupling circuit is interposed between the drivers 21 and the individual electrode sets 12. For this purpose, respective impedance transformation circuits 81, preferably configured of gallium arsenide field effect transistor source-follower circuits, as diagrammatically illustrated in the broken lines in FIG. 5, are employed. The impedance transformation characteristics of such source-follower drive circuits effectively provide an impedance transition between a 50 ohm input (drivers 21) and a 1-5 ohm output (sets of electrode 12), resulting in a loss therethrough on the order of 17 dB. However, this loss does not prevent coupling of R.F. input power at the frequency range of interest into the acoustic bulk. By driving the phrased array electrodes in sets, there is effectively obtained a spacial combining of the power launched by the individual electrode sets to provide sufficient acoustic energy for downstream detection at receiver array 31 and subsequent signal processing.

As pointed out above, the individual electrodes 61 of the receiver array are coupled over links 62 to bonding pads 63 at opposite edges 58 and 59 of the crystal. These bonding pads, in turn, provide signal coupling ports to downstream signal preamplification circuits which effectively provide the necessary impedance match between the low impedance (on the order of 25 ohms) provided by the receiver electrodes 61 and the 50 ohm impedance of downstream signal processing circuitry. For this purpose, impedance transformation is obtained by adjusting the length of the output interconnect lines.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A signal processing apparatus comprising:
   an acoustic bulk;
   first means, coupled to said acoustic bulk, for receiving information signals and for launching acoustic waves into said bulk and causing said acoustic waves to be dispersed through said bulk in accordance with the frequency contents of said information signals said first means comprising an acoustic wave generating medium mechanically coupled with said acoustic bulk, a multiplicity of electrode elements arranged in closely spaced relationship with one another on a first surface portion of said acoustic wave generating medium, a first plurality of signal drivers to which said information signals are coupled for application to said multiplicity of electrode elements, respective ones of the signal drivers of said first plurality being coupled to respectively adjacent first sets of first and second sets of electrode elements into which said multiplicity of electrode elements are subdivided, and a second plurality of signal drivers to which said information signals are coupled for application to said multiplicity of electrode elements, respective ones of the signal drivers of said second plurality being coupled to respectively adjacent second sets of electrode elements, and wherein the outputs of said first signal drivers are shifted in phase with respect to the outputs of said second signal drivers; and second means, coupled to a prescribed information detection region of said acoustic bulk, for detecting dispersed acoustic waves that have been launched into said bulk by said first means and for providing an output representative thereof.

2. A signal processing apparatus according to claim 1, wherein said second means comprises an acoustic wave responsive medium mechanically coupled with said prescribed information detection region of said acoustic bulk and a multiplicity of electrode elements arranged in closely spaced relationship with one another on a first surface portion of said acoustic wave responsive medium.

3. A signal processing apparatus according to claim 1, wherein said acoustic wave generating medium is mechanically coupled with said prescribed information detection region of said acoustic bulk and said second means includes a multiplicity of electrode elements arranged in closely spaced relationship with one another on a surface portion of said acoustic wave generating medium that is coupled with said prescribed information detection region of said acoustic bulk.

4. A signal processing apparatus according to claim 1, wherein said first means further includes a dielectric layer selectively formed on said acoustic wave generating medium so as to have an aperture therein exposing said first surface portion of said acoustic wave generating medium on which the multiplicity of electrode elements of said first means are arranged in closely spaced relationship with one another, and first and second pluralities of signal conductors extending over said dielectric layer and being electrically coupled with said first and second pluralities of signal drivers, respectively.

5. A signal processing apparatus according to claim 4, wherein said acoustic wave generating medium is mechanically coupled with said prescribed information detection region of said acoustic bulk and said second means includes a multiplicity of electrode elements arranged in closely spaced relationship with one another on a surface portion of said acoustic wave generating medium that is coupled with said prescribed information detection region of said acoustic bulk.

6. A signal processing apparatus according to claim 5, wherein said second means further includes said dielectric layer selectively formed on that surface portion of said acoustic wave generating medium that is coupled with said prescribed information detection region of said acoustic bulk, so as to have an aperture therein exposing said that surface portion of said acoustic wave generating medium on which the multiplicity of electrode elements of said second means are arranged in closely spaced relationship with one another, and third and fourth pluralities of signal conductors extending over said dielectric layer and being electrically coupled with interleaved pluralities of the multiplicity of electrode elements of said second means.

7. A signal processing apparatus according to claim 6, wherein the shape of said aperture is contoured to define a prescribed apodization of the acoustic wave launched into said bulk.

8. A signal processing apparatus according to claim 1, wherein said signal drivers comprise field effect transistor buffer amplifier circuits coupled to said sets of electrodes in a source-follower configuration.

9. A signal processing apparatus according to claim 1, wherein the outputs of said first signal drivers are shifted in phase by 180 degrees with respect to the outputs of said second signal drivers.

10. A radio wave signal processing apparatus comprising:

an acoustic bulk;

first means, coupled to said acoustic bulk, for receiving radio wave signals having a frequency on the order of at least one GHz. and for launching acoustic waves into said bulk and causing said acoustic waves to be dispersed through said bulk in accordance with the frequency contents of said information signals, said first means comprising an acoustic wave generating medium mechanically coupled with said acoustic bulk, a multiplicity of sets of interdigital electrodes disposed on a first surface portion of said acoustic wave generating medium, a first plurality of impedance transforming signal drivers to which said radio wave signals are coupled for application to first sets of said multiplicity of electrode elements, respective ones of the signal drivers of said first plurality being coupled to respectively adjacent first sets of interdigital electrodes, and a second plurality of impedance transforming signal drivers to which said R.F. signals are coupled for application to second sets of said interdigital electrodes, respective ones of the signal drivers of said second plurality being coupled to respectively adjacent second sets of said interdigital electrodes, and wherein the outputs of said first signal drivers are effectively complementary to the outputs of said second signal drivers; and second means, coupled to a prescribed information detection region of said acoustic bulk, for detecting dispersed acoustic waves that have been launched into said bulk by said first means and for providing an output representative thereof.

11. A signal processing apparatus according to claim 10, wherein said second means comprises an acoustic wave responsive medium mechanically coupled with said prescribed information detection region of said acoustic bulk and a plurality of interdigital electrodes disposed on a first surface portion of said acoustic wave responsive medium.

12. A signal processing apparatus according to claim 10, wherein said acoustic wave generating medium is mechanically coupled with said prescribed information detection region of said acoustic bulk and said second means includes a plurality of interdigital electrodes disposed on a surface portion of said acoustic wave generating medium that is coupled with said prescribed information detection region of said acoustic bulk.

13. A signal processing apparatus according to claim 10, wherein said first means further includes a dielectric layer selectively formed on said acoustic wave generating medium so as to have an aperture therein exposing said first surface portion of said acoustic wave generating medium on which the interdigital electrodes of said first means are disposed, and first and second pluralities of signal conductors extending over said dielectric layer and being electrically coupled with said first and second pluralities of impedance transforming signal drivers, respectively.

14. A signal processing apparatus according to claim 13, wherein said acoustic wave generating medium is mechanically coupled with said prescribed information detection region of said acoustic bulk and said second means includes a plurality of interdigital electrodes disposed on a surface portion of said acoustic wave generating medium that is coupled with said prescribed information detection region of said acoustic bulk.

15. A signal processing apparatus according to claim 14, wherein said second means further includes said dielectric layer selectively formed on that surface portion of said acoustic wave generating medium that is coupled with said prescribed information detection region of said acoustic bulk, so as to have an aperture therein exposing said that surface portion of said acoustic wave generating medium on which the plurality of interdigital electrodes of said second means are disposed, and third and fourth pluralities of signal conductors extending over said dielectric layer and being electrically coupled with interleaved ones of the plurality of interdigital electrodes of said second means.

16. A signal processing apparatus according to claim 15, wherein the shape of said aperture is contoured to define a prescribed apodization of the acoustic wave launched into said bulk.

17. A signal processing apparatus according to claim 15, wherein said signal drivers comprise field effect transistor buffer amplifier circuits coupled to said first and second sets of interdigital electrodes in a source-follower configuration.

* * * * *